United States Patent
Murai

(10) Patent No.: US 6,705,708 B2
(45) Date of Patent: *Mar. 16, 2004

(54) PIEZOELECTRIC THIN-FILM ELEMENT, INK-JET HEAD USING THE SAME, AND METHOD FOR MANUFACTURE THEREOF

(75) Inventor: Masami Murai, Nagano (JP)

(73) Assignee: Seiko Espon Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/067,839

(22) Filed: Feb. 8, 2002

(65) Prior Publication Data

US 2002/0130929 A1 Sep. 19, 2002

(30) Foreign Application Priority Data

| Feb. 9, 2001 | (JP) | 2001-033518 |
| Feb. 9, 2001 | (JP) | 2001-033519 |
| Oct. 5, 2001 | (JP) | 2001-310263 |
| Jan. 29, 2002 | (JP) | 2002-020667 |

(51) Int. Cl.⁷ .................. B41J 2/045; H01L 41/083
(52) U.S. Cl. ............................... 347/70; 310/324
(58) Field of Search .................. 347/68, 70–72; 310/328, 324

(56) References Cited

U.S. PATENT DOCUMENTS

2003/0076007 A1 * 4/2003 Murai .................. 310/324

FOREIGN PATENT DOCUMENTS

| EP | 0976560 A2 * | 2/2000 |
| JP | 08-335676 | 12/1996 |
| JP | 10-81016 | 3/1998 |

* cited by examiner

Primary Examiner—Judy Nguyen
(74) Attorney, Agent, or Firm—Sterne, Kessler, Goldstein & Fox P.L.L.C.

(57) ABSTRACT

A piezoelectric element with stable and excellent piezoelectric properties is made by: a step of forming a diaphragm 30 (31, 32) on a substrate 20 (S1); a step of forming a bottom electrode 33 on the diaphragm 30 (S2); a step of forming a first piezoelectric layer 43a on the bottom electrode 33 (S3); a step of patterning both the piezoelectric layer 43a and the bottom electrode 33 (S4); a step of forming a second piezoelectric layer on the piezoelectric layer 43a and on the diaphragm 30 to mature a piezoelectric film 43 (S5); and a step of forming a top electrode 44 on the piezoelectric film 43 (S6).

8 Claims, 11 Drawing Sheets

1 : INK-JET RECORDING HEAD

PIEZOELECTRIC THIN-FILM ELEMENT, INK-JET HEAD USING THE SAME, AND METHOD FOR MANUFACTURE THEREOF

BACKGROUND OF THE INVENTION

1. Field of the Invention

The present invention relates to a piezoelectric element having an electromechanical conversion function. In particular, the present invention relates to a piezoelectric element that makes it possible to obtain an excellent piezoelectric characteristic when used in an ink-jet recording head, a method for the manufacture thereof, and an ink-jet recording head and a printer using such piezoelectric elements.

2. Description of the Related Art

Ink-jet recording heads use piezoelectric elements as driving mechanism for ink ejection in printers. The piezoelectric elements usually comprise a piezoelectric thin film and a top electrode and a bottom electrode disposed so as to sandwich the film.

Piezoelectric elements with improved characteristics have been developed by regulating the crystal structure of a thin film composed of lead zirconium titanate (PZT) or forming Ti nuclei on the bottom electrode. For example, Japanese Patent Application Laid-open No. H10-81016 disclosed a PZT thin film provided with a rhombohedral crystal structure and the prescribed orientation degree. Furthermore, Japanese Patent Application Laid-open No. H8-335676 disclosed a piezoelectric element in which a titanium nucleus was formed on an Ir bottom electrode.

However, the problem associated with the conventional piezoelectric elements was that piezoelectric films with prescribed orientation degree were difficult to obtain with good stability and reproducibility. Such piezoelectric elements could not provide stable and good piezoelectric characteristics and accounted for insufficient printing performance of ink-jet recording heads or printers.

The prescribed orientation degree of piezoelectric film was especially difficult to obtain with good stability and reproducibility when a bottom electrode formed on a diaphragm was patterned to the prescribed shape and then a piezoelectric film was formed on the bottom electrode. Another problem was that the thickness of the bottom electrode became non-uniform and the crystals of the piezoelectric film became discontinuous in the vicinity of the patterning boundary of bottom electrode.

SUMMARY OF THE INVENTION

Accordingly, it is an object of the present invention to provide a piezoelectric element with stable and good piezoelectric characteristic by obtaining the prescribed orientation degree of piezoelectric film with good stability and reproducibility and also a method for the manufacture of such a piezoelectric element. Another object of the present invention is to provide a piezoelectric element demonstrating excellent characteristics by improving the uniformity of the bottom electrode thickness and eliminating the discontinuity of crystals of the piezoelectric film and also a method for the manufacture of such a piezoelectric element.

Still another object is to provide an ink-jet recording head employing the aforesaid piezoelectric elements as ink ejection drive mechanism, a method for the manufacture thereof, and an ink-jet printer.

A method for the manufacture of a piezoelectric element in accordance with the present invention comprises a step of forming a diaphragm on a substrate, a step of forming a bottom electrode on the diaphragm, a step of forming a first piezoelectric layer constituting a part of a piezoelectric film on the bottom electrode, a step of patterning the first piezoelectric layer and the bottom electrode to the prescribed shape, a step of forming a second piezoelectric layer constituting another part of the piezoelectric film on the first piezoelectric layer that was left by the patterning and the diaphragm from which the first piezoelectric layer was removed, and a step of forming a top electrode on the piezoelectric film.

Forming a piezoelectric film in two stages makes it possible to form PZT having stable 100 plane orientation degree which is not affected by humidity or the like. Furthermore, the non-uniformity of the bottom electrode thickness and discontinuity of piezoelectric crystals can be prevented.

Another method for the manufacture of a piezoelectric element in accordance with the present invention comprises a step of forming a diaphragm on a substrate, a step of forming a bottom electrode on the diaphragm, a step of forming a first Ti layer on the bottom electrode, a step of patterning the bottom electrode to the prescribed shape, a step of forming a second Ti layer on the bottom electrode that was left by the patterning and the diaphragm from which the bottom electrode was removed, a step of forming a piezoelectric film on the bottom electrode on which the second Ti layer was formed, and a step of forming a top electrode on the piezoelectric film.

Forming a Ti layer in two stages makes it possible to form a piezoelectric film having a stable 100 plane orientation degree which is not affected by humidity or the like.

A method for the manufacture of an ink-jet recording head in accordance with the present invention comprises a step of etching the substrate of the piezoelectric element obtained by the above-described method and forming pressure chambers and a step of forming a nozzle plate covering the pressure chambers.

In the piezoelectric element in accordance with the present invention, a diaphragm, a bottom electrode, a piezoelectric film, and a top electrode are successively stacked on a substrate. The bottom electrode is patterned to a prescribed shape, and the piezoelectric film is formed on the bottom electrode that was left by the patterning and the diaphragm from which the bottom electrode was removed. The number of layers in the portion of the piezoelectric film, which was formed on the bottom electrode that was left by the patterning, is greater than that in the portion formed on the diaphragm.

Furthermore, in another piezoelectric element in accordance with the present invention, the piezoelectric film is formed on the bottom electrode left by the patterning and on the diaphragm from which the bottom electrode was removed and the thickness of the bottom electrode is uniform.

In still another piezoelectric element in accordance with the present invention, the piezoelectric film is formed on the bottom electrodes left by the patterning and on the diaphragm from which the bottom electrode was removed. The portion of the piezoelectric film that was formed on the diaphragm has a prescribed orientation.

In the above-described piezoelectric element, a portion of the piezoelectric film, which was formed on the bottom electrode that was left by the patterning, preferably has a 100 plane orientation degree of no less than 70%.

The ink-jet recording head in accordance with the present invention comprises the above-described piezoelectric elements, pressure chambers whose internal volume changes under the effect of mechanical displacement of the piezoelectric elements, and ejection openings linked to the pressure chambers and ejecting ink droplets.

The ink-jet printer in accordance with the present invention comprises the above-described ink-jet recording head in a printing mechanism.

The term "100 plane orientation degree" used in the present specification means a ratio of I(100) to a sum of I(100), I(110), and I(111), where I(XYZ) stands for a diffraction intensity of a peak (2θ) corresponding to a XYZ plane when a CuKα beam is used in the X ray wide-angle diffraction method.

DESCRIPTION OF THE PREFERRED EMBODIMENTS

Preferred embodiments of the present invention will be described below with reference to the appended drawings.
(Entire Configuration of Ink-Jet Printer)

Figure 1:
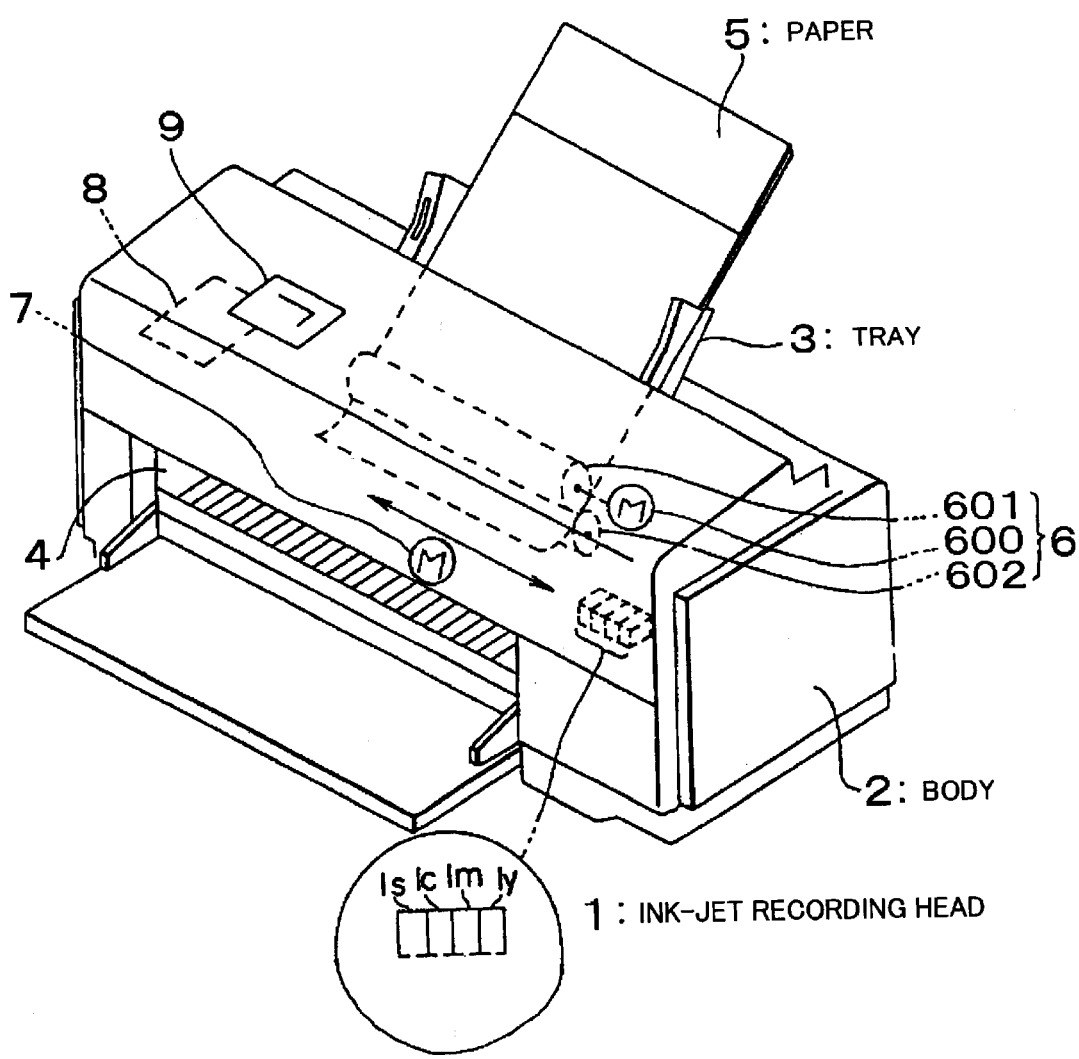
FIG. 1 is a perspective view illustrating a structure of the printer using the piezoelectric element of the present invention.

FIG. 1 is a perspective view illustrating a structure of the printer using the piezoelectric element. In this printer, a tray 3, a release opening 4, and a control button 9 are provided in a body 2. Furthermore, an ink-jet recording head 1, a feeding mechanism 6, and a control circuit 8 are provided inside the body 2.

The ink-jet recording head 1 comprises a plurality of piezoelectric elements formed on a substrate and is composed so that it can eject ink from a nozzle according to an ejection signal supplied from the control circuit 8.

The body 2 is a case of the printer. The feeding mechanism 6 is disposed in a position in which paper 5 can be fed from the tray 3, and the ink-jet recording head 1 is disposed so that printing can be conducted on the paper 5. The configuration of the tray 3 allows for feeding the paper 5 before the printing to the feeding mechanism 6. The release opening 4 is an output opening for releasing the paper 5 upon completion of printing.

The feeding mechanism 6 comprises a motor 600, rollers 601, 602, and another mechanical structure which is not shown in the figures. The motor 600 can rotate in response to a drive signal supplied from the control circuit 8. The mechanical structure can transmit the rotating force of the motor 600 to the rollers 601, 602. The rollers 601, 602 rotate when the rotating force of the motor 600 is transmitted. This rotation of the rollers pulls in the paper 5 located in the tray 3 and feeds the paper for printing with the head 1.

The control circuit 8 comprises CPU, ROM, RAM, and interface circuits that are not shown in the figure. The control circuit 8 can supply the drive signal to the feeding mechanism 6 or the ejection signal to the ink-jet recording head 1 according to printing information supplied from a computer via a connector (not shown in the figures). Furthermore, the control circuit 8 also sets and resets the operation mode according to operation signals from the control panel 9.

The printer of the present embodiment is a high-performance printer because it comprises the below-described ink-jet recording head having stable and high piezoelectric characteristics and demonstrating good printing performance.

(Configuration of the Ink-Jet Recording Head)

Figure 2:
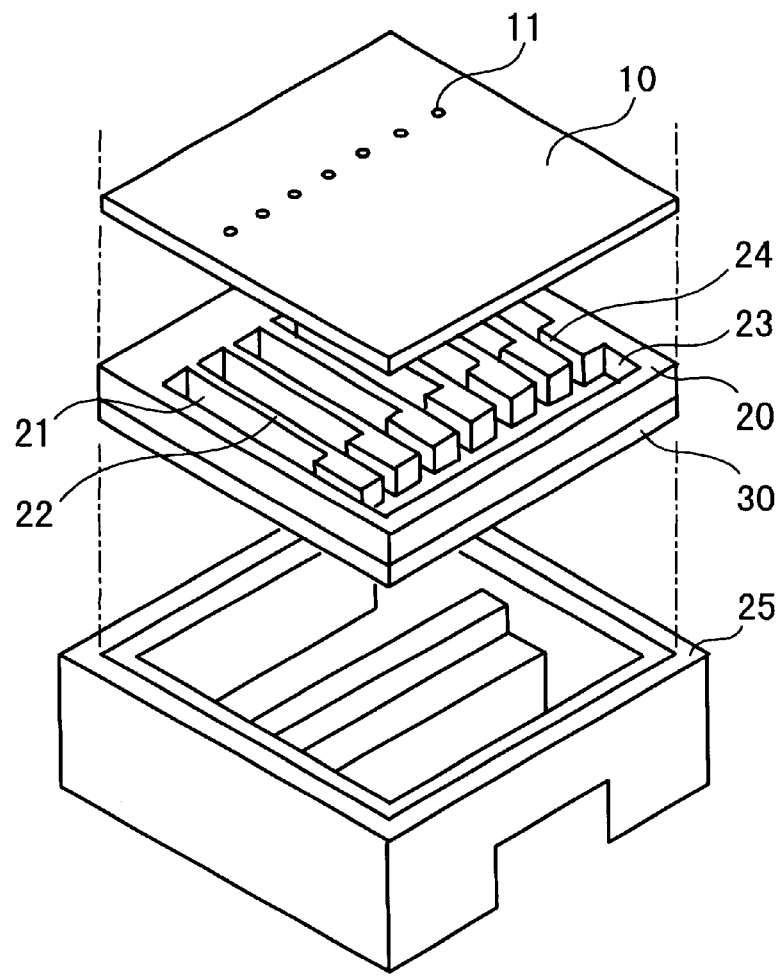
FIG. 2 illustrates a structure of the ink-jet recording head provided with the piezoelectric element.

FIG. 2 illustrates a structure of the ink-jet recording head comprising the piezoelectric element. The ink-jet recording head 1, as shown in the figure, comprises a nozzle plate 10, a pressure chamber substrate 20, and a diaphragm 30.

The pressure chamber substrate 20 comprises cavities (pressure chambers) 21, side walls (partitions) 22, a reservoir 23, and supply openings 24. The cavities 21 are the spaces that are formed by etching in a substrate such as silicon substrate for storing ink to be ejected. The side walls 22 are formed so as to provide partitions between the cavities 21. The reservoir 23 is a common channel for filling the cavities 21 with the ink. The supply openings 24 are formed so that the ink can be introduced from the reservoir 23 to the cavities 21.

The nozzle plate 10 is attached on one surface of the pressure chamber substrate 20 so that nozzle holes 11 formed therein are disposed in positions corresponding to respective cavities 21 provided in the pressure chamber substrate 20. The pressure chamber substrate 20 having the nozzle plate 10 attached thereto is further enclosed in a case 25 to form the ink-jet recording head 1.

The diaphragm 30 is attached to the other surface of the pressure chamber substrate 20. Piezoelectric elements (not shown in the figure) are provided on the diaphragm 30. An ink tank opening (not shown in the figure) is provided in the diaphragm 30, and the ink that was stored in the ink tank (not shown in the figures) can be supplied into the pressure chamber substrate 20.

(Configuration of Piezoelectric Element)

Figure 3A:
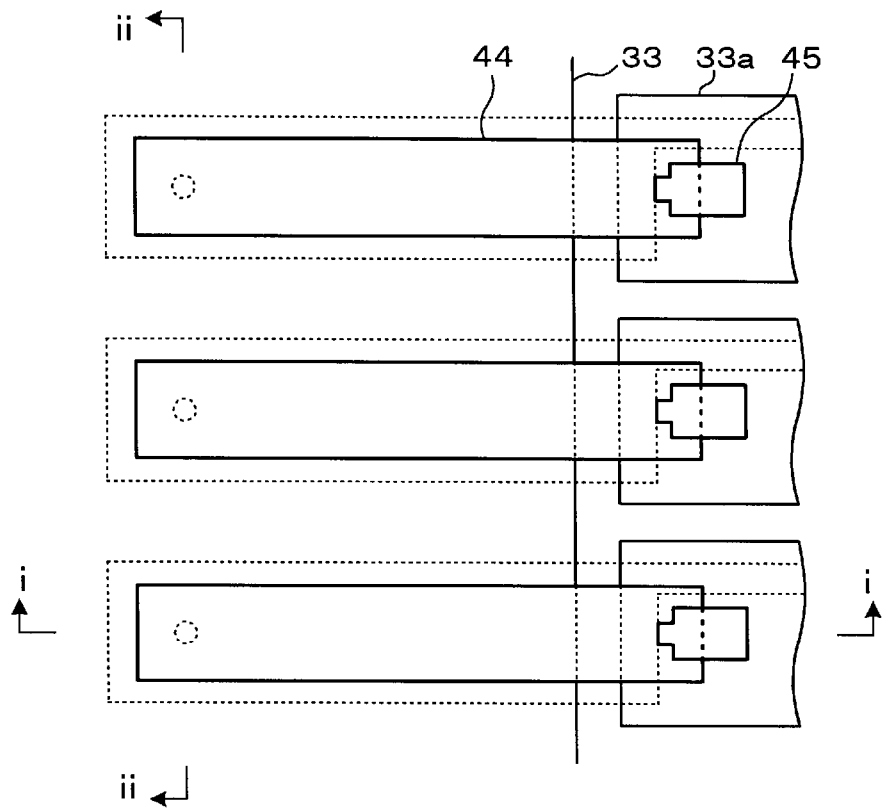
FIG. 3A is an enlarged plan view of a piezoelectric element portion of the ink-jet recording head and FIG. 3B is a cross-sectional view along the i—i line therein.
Figure 3B:
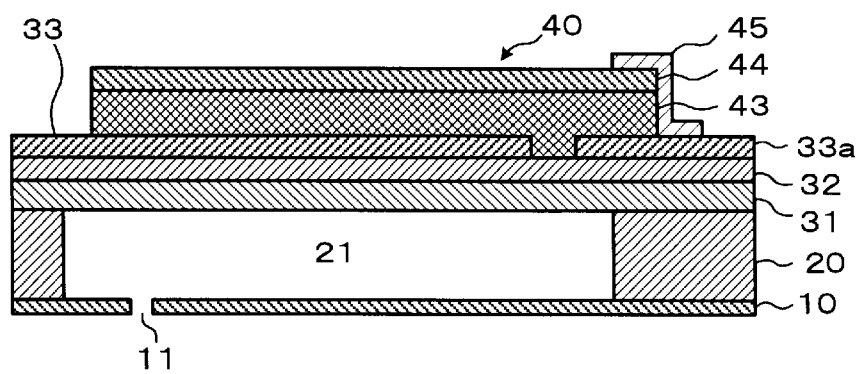
Figure 4:
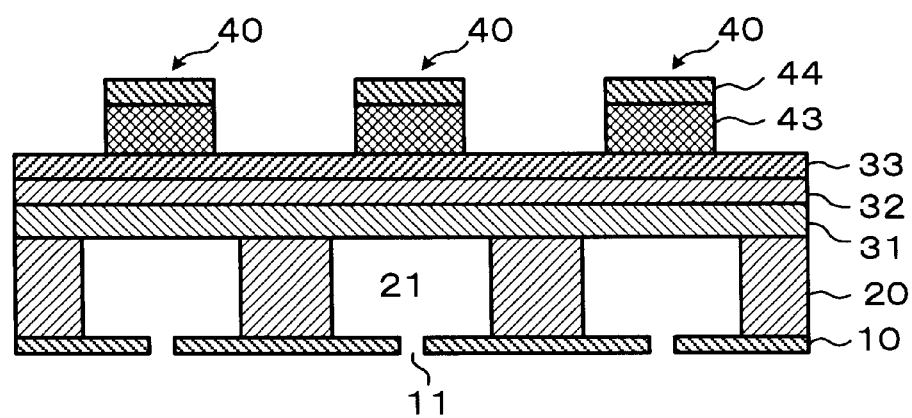
FIG. 4 is a cross-sectional view along the ii—ii line in FIG. 3A.

FIG. 3A is an expanded plan view of a piezoelectric element portion of the ink-jet recording head and FIG. 3B is a cross-sectional view thereof along the i—i line. FIG. 4 is a cross-sectional view along the ii—ii line in FIG. 3A.

As shown in those figures, the piezoelectric element is produced by successively stacking a $ZrO_2$ film 32, a bottom electrode 33, a piezoelectric film 43, and a top electrode 44 on an insulating film 31.

The insulating film 31 is formed on the pressure chamber substrate 20 composed, for example, of single-crystal silicon with a thickness of 220 μm. Preferably, a film composed of silicon oxide ($SiO_2$) is formed to a thickness of 1.0 μm.

The ZrO$_2$ film 32 is a layer providing the elasticity; it is integrated with the insulating film 31, constituting a diaphragm 30. For the ZrO$_2$ film 32 to have a function of providing the elasticity, it preferably has a thickness of no less than 200 nm and no more than 800 nm.

An adhesive layer (not shown in the figures) consisting of a metal, preferably, titanium or chromium, may be provided for bonding the ZrO$_2$ film 32 and the bottom electrode 33. When the adhesive layer is provided, the preferred thickness thereof is no less than 10 nm.

The bottom electrode 33 has a layered structure. In this case the layers contain Pt and Ir. For example, the electrode has an Ir-containing layer/Pt-containing layer/Ir-containing layer structure. The thickness of the entire bottom electrode 33 is, for example, 100 nm. No specific limitation is placed on the layered structure of the bottom electrode 33. Thus, it may have a two-layer configuration of Ir-containing layer/Pt-containing layer, or a two-layer structure of Pt-containing layer/Ir-containing layer. Furthermore, the bottom electrode 33 may also be composed only of an Ir-containing layer.

The piezoelectric film 43 is a piezoelectric polycrystalline ceramic. The piezoelectric film 43 is preferably composed of a ferroelectric piezoelectric material such as lead zirconium titanate (PZT), or a material obtained by adding a metal oxide such as niobium oxide, nickel oxide, or magnesium oxide thereto. The composition of the piezoelectric film 43 is selected appropriately by taking the characteristics and application of the piezoelectric element into account. Specific preferred examples include lead titanate, lead zirconium titanate, lead zirconate, lead lanthanum titanate, lead lanthanum zirconate titanate, or lead zirconium titanate magnesium niobate. Furthermore, a film with excellent piezoelectric characteristics can also be obtained by adding an appropriate amount of niobium to lead titanate or lead zirconate.

A portion of the piezoelectric film 43 which is formed on the bottom electrode 33 preferably has a 100 plane orientation degree of no less than 70% and no more than 100%, more preferably, no less than 80% in order to obtain good piezoelectric characteristics. It is further preferred that a 110 plane orientation degree is no more than 10%, with a 111 plane orientation degree assuming the balance. The sum of the 100 plane orientation degree, the 110 plane orientation degree, and the 111 plane orientation degree is 100%. The thickness of the piezoelectric film 43 is, for example, no less than 1000 nm and no more than 1500 nm.

The top electrode 44 is an electrode forming a pair with the bottom electrode 33; preferably, it is composed of Pt or Ir. The thickness of the top electrode 44 is preferably about 50 nm.

The bottom electrode 33 is common for all piezoelectric elements. By contrast, a wiring electrode 33a is positioned in the same height as the bottom electrode 33, but is separated from the bottom electrode 33 and the other wiring electrodes 33a. The wiring electrode 33a can be electrically connected to the top electrode 44 via a strip electrode 45.

(Operation of Ink-Jet Recording Head)

Printing operation with the ink-jet recording head 1 of the above-described configuration will be explained below. If a drive signal is received from the control circuit 8, the feeding mechanism 6 is activated and paper 5 is transported to the position where printing can be conducted with the head 1. When no ejection signal is supplied from the control circuit 8 and voltage is not applied between the bottom electrode 33 and the top electrode 44 of a piezoelectric element, the piezoelectric film 43 is not subjected to deformation. No pressure changes occur in the cavity 21 provided with the piezoelectric element that has not been supplied with the ejection signal, and ink drops are not ejected from the nozzle hole 11 of this cavity.

On the other hand, when an ejection signal is supplied from the control circuit 8 and a constant voltage is applied between the bottom electrode 33 and the top electrode 44 of the piezoelectric element, the piezoelectric film 43 is subjected to deformation. In the cavity 21 provided with the piezoelectric element that was supplied with the ejection signal, the diaphragm 30 greatly deflects. As a result, the pressure inside the cavity 21 rises instantaneously and an ink droplet is ejected from the nozzle hole 11. Printing of any symbols or drawings can be conducted by individually supplying the ejection signals to piezoelectric elements in the head which are located in positions in which printing is desired.

(Manufacturing Method of the First Embodiment)

Figure 5:
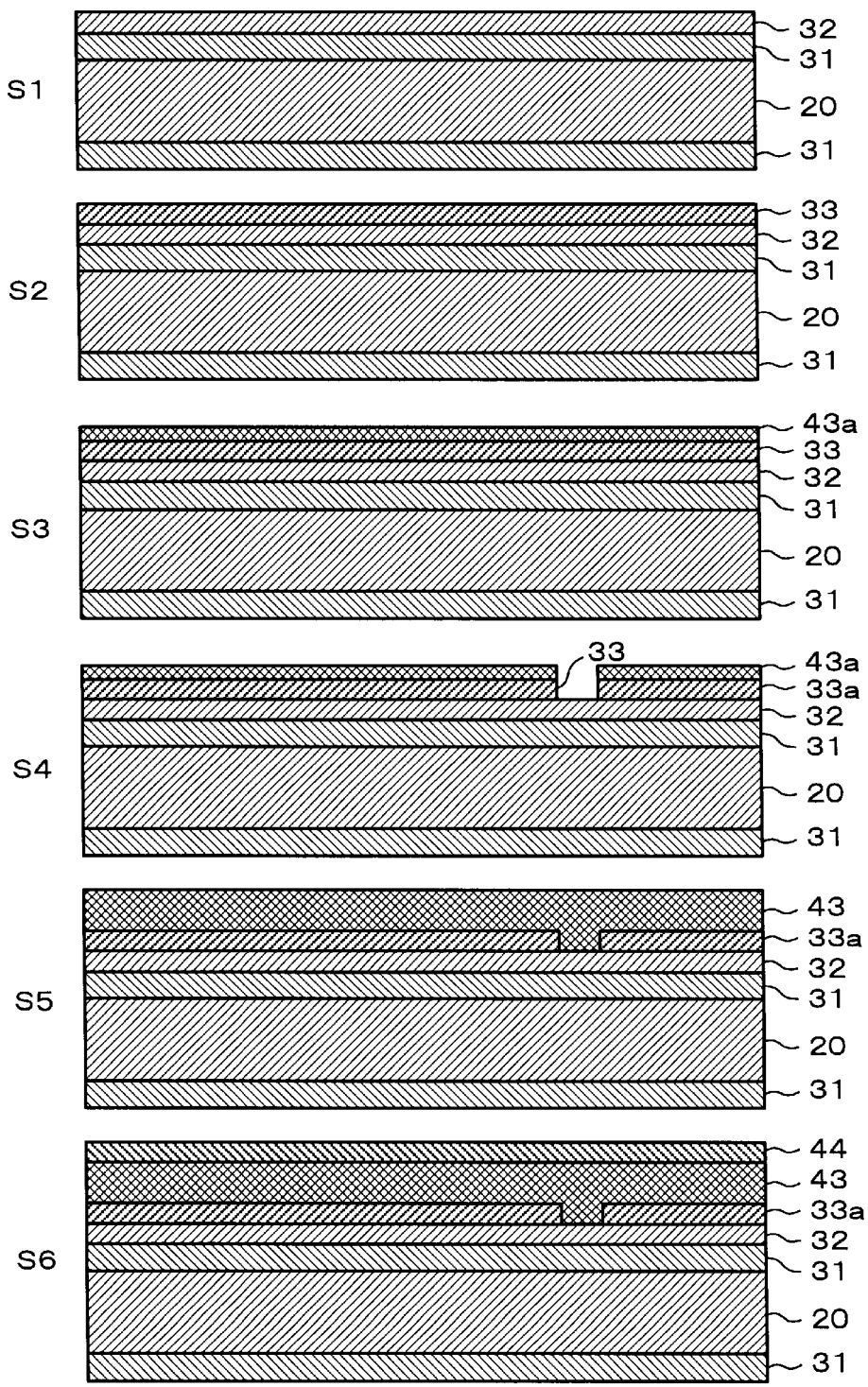
FIG. 5 is a cross-sectional schematic view illustrating a method for the manufacture of the piezoelectric element and the ink-jet recording head of the first embodiment.
Figure 6:
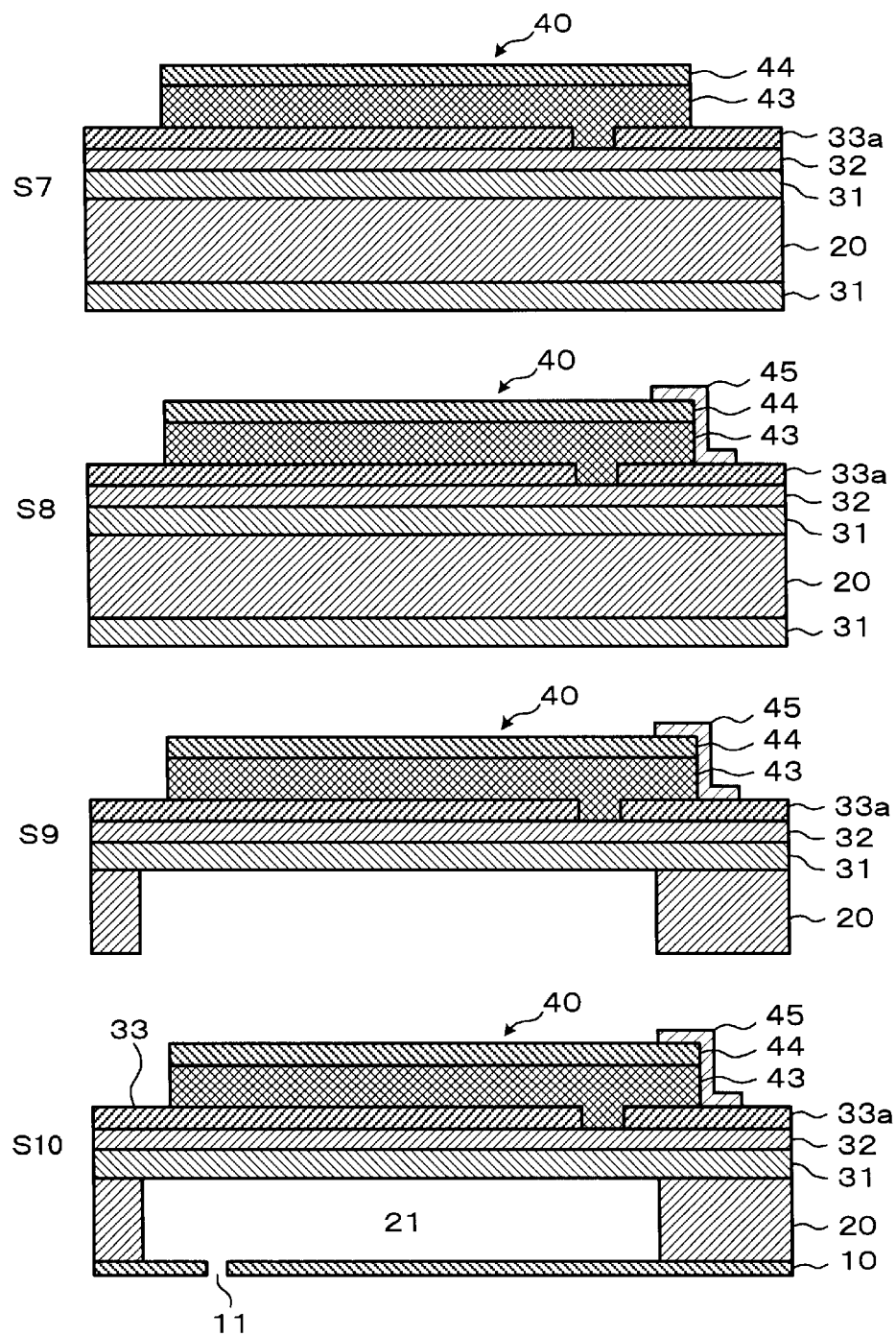
FIG. 6 is a cross-sectional schematic view illustrating a method for the manufacture of the piezoelectric element and the ink-jet recording head of the first embodiment.

A method for the manufacture of the piezoelectric element in accordance with the present invention will be described below. FIGS. 5 and 6 are cross-sectional schematic views illustrating a method for the manufacture of the piezoelectric element and the ink-jet recording head of the first embodiment.

Step of forming a diaphragm (S1)

An insulating film 31 is formed on a silicon substrate 20. The thickness of the silicon substrate 20 is, for example, about 200 µm. In the manufacture of the insulating film, a high-temperature treatment is conducted in an oxidizing atmosphere composed of oxygen or steam and a film of silicon dioxide (SiO$_2$) with a thickness of about 1 µm is formed. Besides the usually used thermal oxidation method, a CVD method can be used in this step.

Then, a ZrO$_2$ film 32 with a thickness of about 400 nm is formed on the insulating film 31. The ZrO$_2$ film 32 is obtained by growing a Zr layer by sputtering or vacuum deposition and then treating it at a high temperature in an oxygen atmosphere.

Step of forming a bottom electrode (S2)

A bottom electrode 33 is then formed on the ZrO$_2$ film 32. The step of forming the bottom electrode 33, for example, comprises a step of forming a third layer containing Ir, a step of forming a second layer containing Pt on the third layer, and a step of forming a first layer containing Ir on the second layer.

The first, second, and third layers are formed by depositing Ir or Pt on the ZrO$_2$ film 32 by sputtering or the like. Prior to forming the bottom electrode 33, an adhesive layer (not shown in the figures) consisting of titanium or chromium may be formed by sputtering or vapor deposition.

It is preferred that once the bottom electrode 33 has been formed, a Ti layer (nucleus) be formed in succession on the bottom electrode 33. The Ti layer is formed to a thickness of no less than 3 nm to no more than 20 nm, for example, by sputtering. The Ti layer is formed as a uniform film on the bottom electrode 33, but it may also have an island-like structure.

Step of forming a first piezoelectric layer (S3)

A piezoelectric film is then formed on the bottom electrode 33. In the first step, a first piezoelectric layer 43a is formed to have a thickness no more than the desired thickness of piezoelectric film 43, or preferably no more than half of the desired thickness. For example, when the piezoelectric film 43 with a total film thickness of 1.5 µm is composed of 7 layers, at least one piezoelectric layer 43a with a thickness of 0.2 µm is formed. A plurality of first layers in which the total thickness is less than half of the total thickness of the piezoelectric film 43 may also be formed.

More specifically, a piezoelectric precursor film is formed by a sol-gel method. Thus, a sol composed of an organic metal alkoxide solution is coated on the bottom electrode by a coating process such as spin coating. Then, the coating is dried for a prescribed time period at a prescribed temperature to evaporate the solvent. The drying is followed by pyrolyzing for a prescribed time period at a prescribed temperature in air for thermal decomposition of organic ligands coordinated with the metal and formation of metal oxide. The piezoelectric precursor films are stacked by repeating the coating, drying, and pyrolyzing steps several times, for example, two times. As a result of drying and pyrolyzing, metal alkoxide and acetic acid salt present in the solution form a metal/oxygen/metal network via thermal decomposition of ligands.

The piezoelectric precursor films are then annealed to crystallize the piezoelectric layer. Due to annealing, the piezoelectric precursor film changes its structure from amorphous to a rhombohedral crystal structure and changes to a layer demonstrating an electromechanical conversion effect. Conducting the above-described steps of forming and annealing the piezoelectric precursor film in one cycle produces a first piezoelectric layer 43a consisting of one layer.

The piezoelectric layer 43a thus formed is affected by the composition of the bottom electrode 33 and the aforesaid Ti layer, and its 100 plane orientation degree measured by X ray diffraction wide-angle method will be about 80%.

By the above-described annealing, the bottom electrode 33 is also partially oxidized and PZT components partially diffuse and then the thickness of the bottom electrode increases. With a method for forming a piezoelectric film after patterning of the bottom electrode, the increase in thickness in the vicinity of patterning boundary of the bottom electrode is typically smaller than the other portion of the bottom electrode, which results in a non-uniform thickness of the bottom electrode. However, with the method of the present embodiment, the piezoelectric layer 43a is formed prior to patterning of the bottom electrode 33. Therefore, the thickness of the bottom electrode overall increases and does not become non-uniform.

Patterning of the bottom electrode and the piezoelectric layer (S4)

The piezoelectric layer 43a is then masked according to a desired shape, and patterning of the piezoelectric layer 43a and the bottom electrode 33 is conducted by etching on the outside thereof. As a result, the wiring electrode 33a is separated from the bottom electrode 33. More specifically, a resist material of uniform thickness is coated on the piezoelectric layer 43a by a spinner method, spray method, or the like (not shown in the figure). Then a mask is formed to a prescribed shape, followed by the formation of a resist pattern on the piezoelectric layer by exposure and development (not shown in the figure). The piezoelectric layer 43a and the bottom electrode 33 are etched out by ion milling or dry etching method usually used therefor and the $ZrO_2$ film 32 is exposed.

Then, a Ti layer (nucleus) is further formed on the piezoelectric layer 43a and the $ZrO_2$ film 32 by a sputtering method or the like. The Ti layer formed at this stage preferably has a thickness of no less than 1 nm and no more than 4 nm. If the thickness of the Ti layer is less than 1 nm, the effect of the seed layer is small. If the thickness is above 4 nm, the formation of PZT crystals is broken on the Ti layer as a boundary and there is a possibility of crystals being discontinuous or of interlayer peeling. It is even more preferred that the Ti layer have a thickness of about 2 nm.

Step of forming a second piezoelectric layer (S5)

A step of forming second piezoelectric layers on the first piezoelectric layer 43a is then implemented. In this step, the operations of coating a piezoelectric precursor and annealing are implemented by the same method as in the step of forming the first layer 43a and it is repeated, for example, six times till the desired thickness of piezoelectric film is obtained. As a result, a piezoelectric film 43 with a total thickness of 1.5 $\mu$m is formed.

In the piezoelectric film 43 thus formed, a portion above the bottom electrode 33 consists of a total of seven layers because the second piezoelectric layers obtained after the patterning step is formed on the first piezoelectric layer 43a. A portion formed in the zone in which the first piezoelectric layer 43a and the bottom electrode 33 were removed by patterning and where the $ZrO_2$ film 32 was exposed consists of a total of six layers. Thus, in the piezoelectric film 43 formed by the method of the present embodiment, the portion formed on the bottom electrode 33 that was left by patterning has a larger number of layers than the portion formed on the diaphragm 30. Furthermore, in the present embodiment, the total thickness of the second piezoelectric layers is greater than the thickness of first piezoelectric layer. Therefore, the portion of the piezoelectric film on the diaphragm 30 from which the bottom electrode was removed can be formed to have a sufficient thickness.

By annealing in the step of forming the first piezoelectric layer, the bottom electrode 33 is partially oxidized and the diffusion of PZT components occurs which results in an overall increase in film thickness. For this reason, the thickness of the bottom electrode does not further increase in the step of forming the second piezoelectric layers. Therefore, the thickness of the bottom electrode 33 does not become non-uniform. Moreover, in the piezoelectric film 43 in the vicinity of patterning boundary of the bottom electrode 33, no cracks are introduced by changes in the thickness of the bottom electrode 33 and the crystals do not become discontinuous in the film surface direction.

As for the piezoelectric film 43, a portion above the bottom electrode 33 is affected by the first piezoelectric layer 43a and becomes a piezoelectric film with a 100 plane orientation degree measured by an X ray diffraction wide-angle method of about 80%. Furthermore, a portion formed in the zone from which the bottom electrode 33 was removed by patterning and where the $ZrO_2$ film 32 was exposed is affected by the Ti layer and has a large orientation in 111 plane.

Furthermore, the thickness of the Ti layer formed after the patterning step (S4) was no more than 4 nm. As a result, the crystal structure is continuous in the film thickness direction between the first piezoelectric layer 43a and the second piezoelectric layer and peeling between the first and second layers is inhibited. For this reason, a highly reliable piezoelectric film 43 can be obtained.

Figure 7:
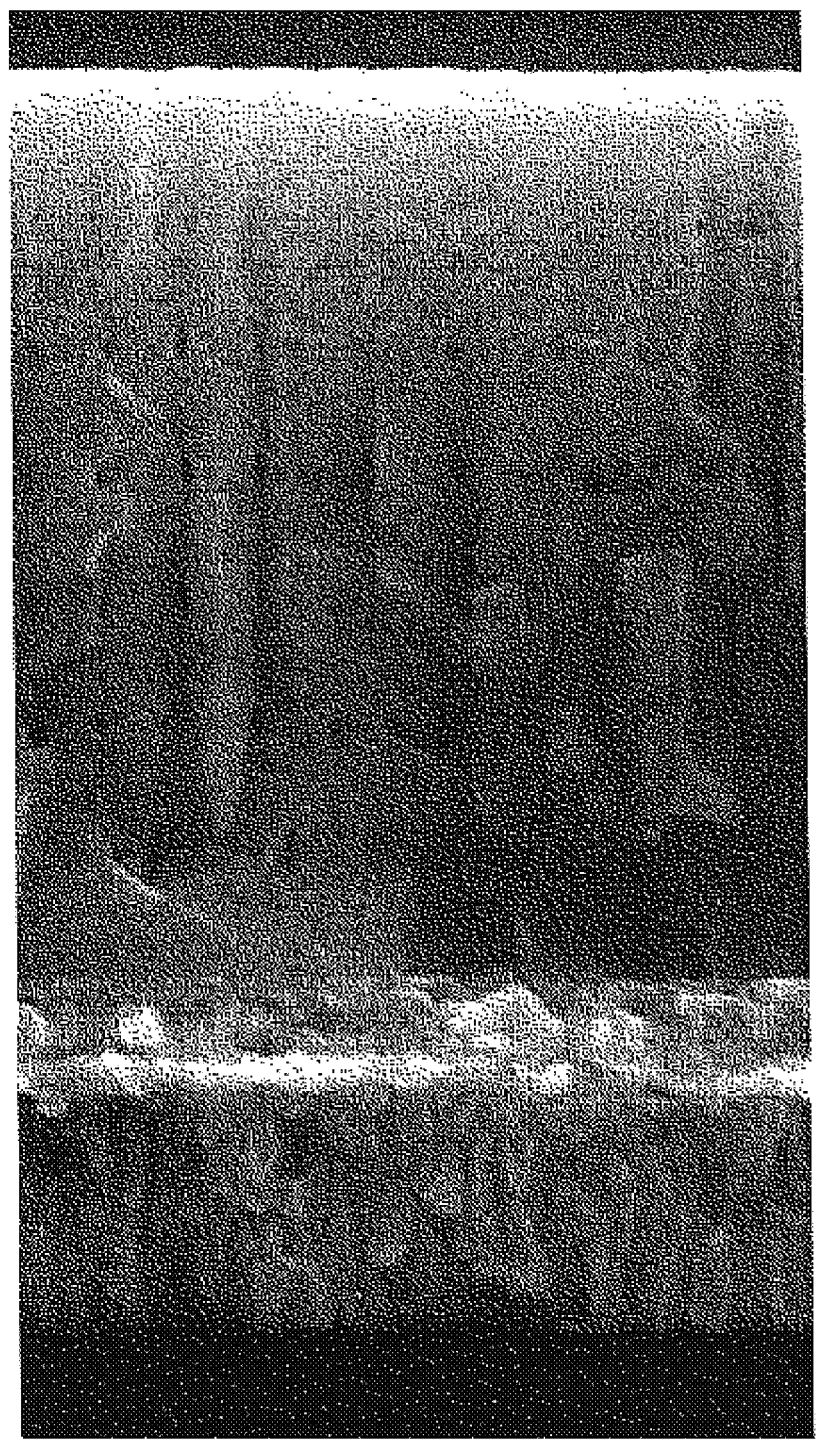
FIG. 7 is a cross-sectional SEM microphotograph of the piezoelectric element obtained by the above-mentioned manufacturing method.
Figure 8:
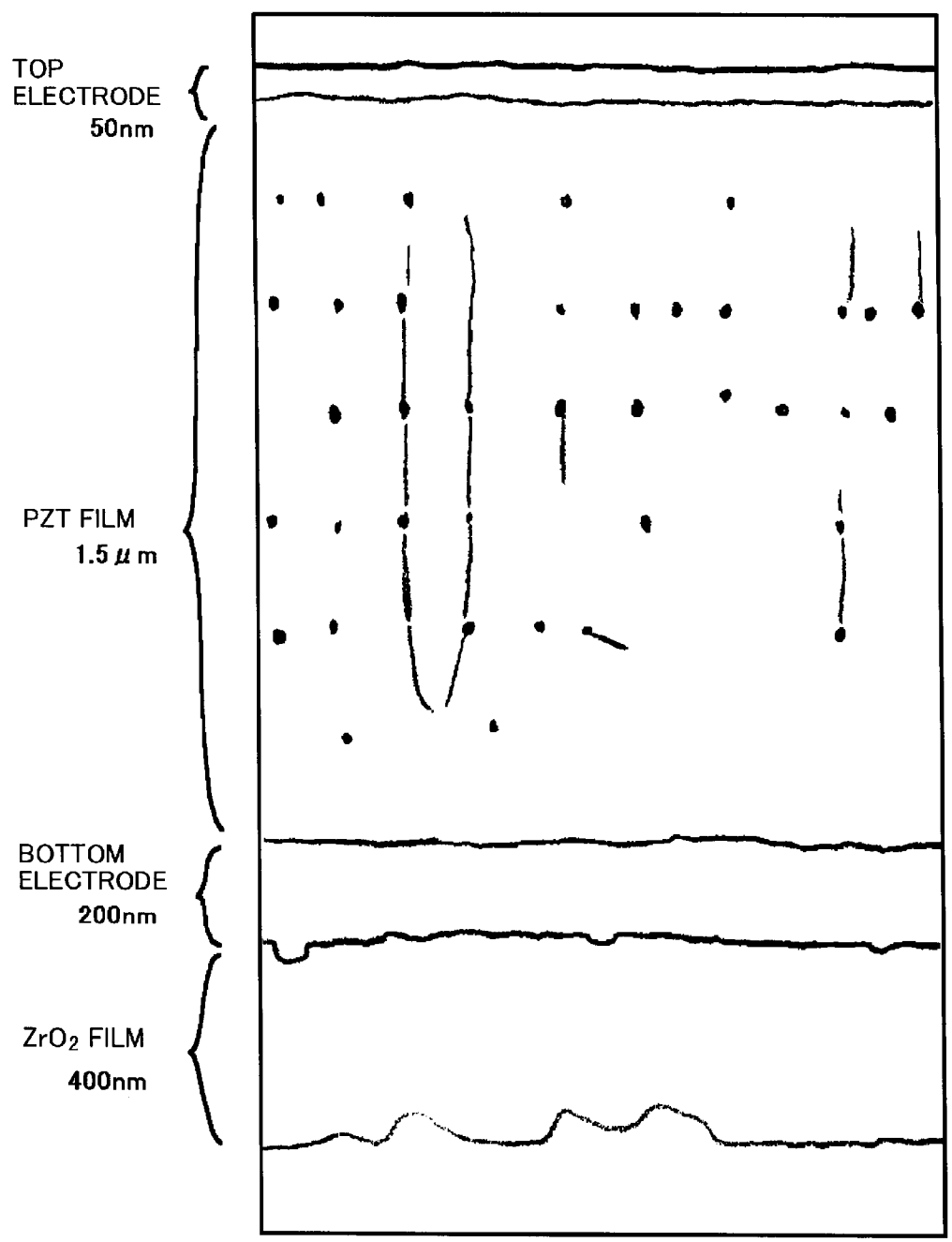
FIG. 8 is a model view of FIG. 7.
Figure 9:
FIG. 9 is a cross-sectional SEM microphotograph of the piezoelectric element of a comparative example.
Figure 10:
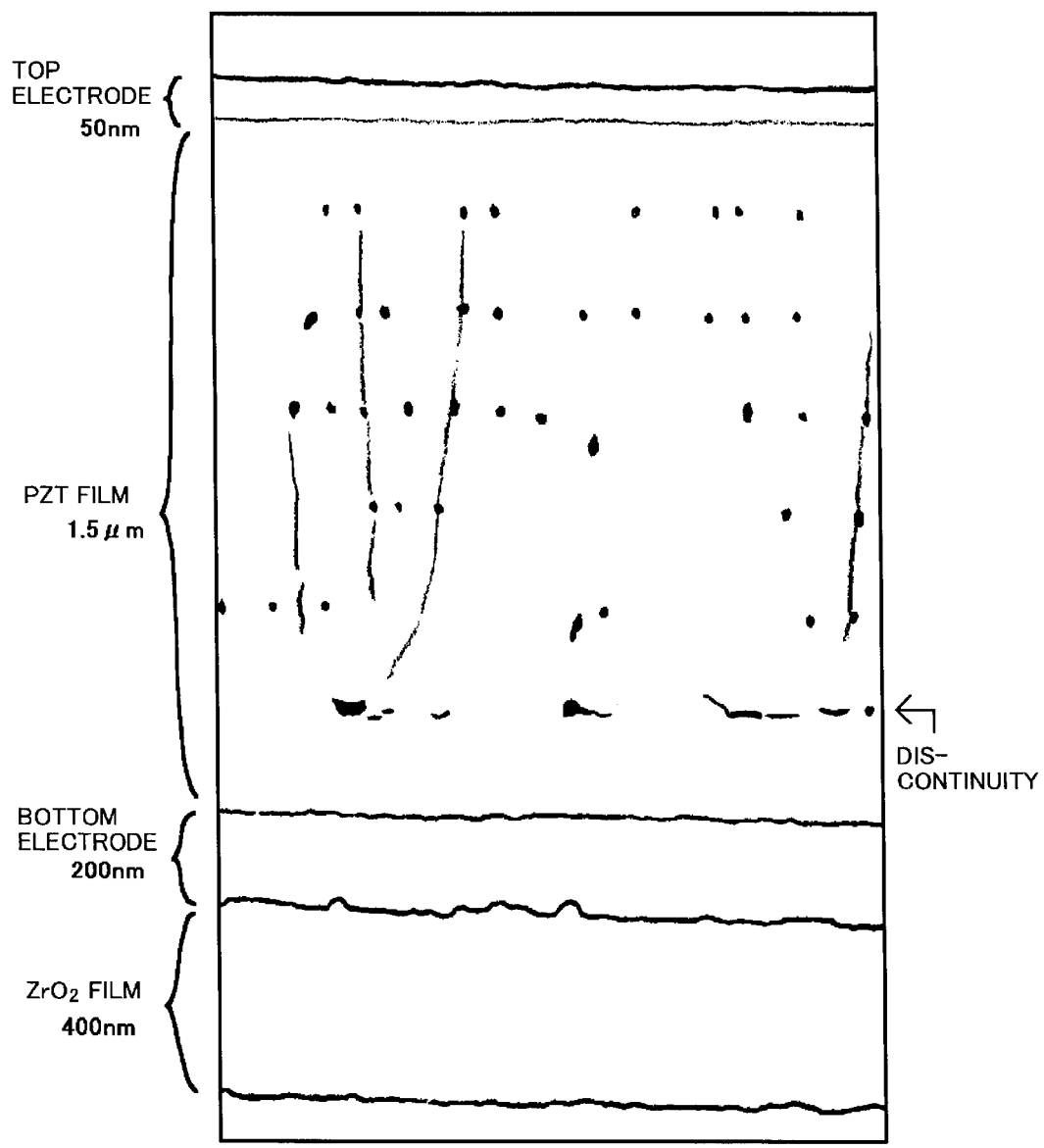
FIG. 10 is a model view of FIG. 9.

FIG. 7 is a cross-sectional SEM microphotograph of the piezoelectric element in which the thickness of the Ti layer formed after the patterning step (S4) in the present embodiment was 2 nm, FIG. 8 is the model thereof. FIG. 9 is a cross-sectional SEM microphotograph of the piezoelectric element in which the thickness of the Ti layer after the patterning step was 5 nm, this element representing a comparative example, FIG. 10 is the model thereof. These microphotographs demonstrate that the PZT crystal structure was continuous when the thickness of the Ti layer was 2 nm. By contrast, when the thickness of the Ti layer was 5 nm, a discontinuous portion appeared between the PZT layers formed before and after the patterning step. The discontinuous portion has a less continuity of crystals than the continuities between the other PZT layers.

Step of forming a top electrode (S6)

A top electrode 44 is formed by an electron beam deposition method or a sputtering method on the piezoelectric film 43. Platinum (Pt), iridium (Ir), or other metal is used as the top electrode 44 and the film is formed to a thickness of 50 nm.

Step of patterning the piezoelectric film and the top electrode (S7)

The piezoelectric film 43 and the top electrode 44 are patterned to a prescribed shape of the piezoelectric element. More specifically, a resist is spin-coated on the top electrode 44 and patterned by exposure and development according to positions in which the pressure chambers have to be made. The remaining resist is used as a mask and the top electrode 44 and the piezoelectric film 43 are etched by ion milling or the like. The piezoelectric element 40 is formed by the above-described steps.

Step of forming a strip electrode (S8)

Then, a strip electrode 45 electrically connecting the top electrode 44 and the wiring electrode 33a is formed. Gold, which has a low electric resistance and a low rigidity, is preferred as a material for the strip electrode 45. Examples of other preferred metals include aluminum and copper. The strip electrode 45 is formed to a thickness of about 0.2 μm and patterning is conducted so as to leave a conductive portion between the top electrode 44 and the wiring electrode 33a.

Step of forming pressure chambers (S9)

Then, pressure chambers 21 are formed by anisotropic etching using an active gas, such as anisotropic etching or a parallel plate reactive ion etching, on the other surface of the pressure chamber substrate 20 where the piezoelectric elements 40 were formed. Portions that were not etched out serve as side walls 22.

Step of bonding a nozzle plate (S10)

Finally, a nozzle plate 10 is bonded with an adhesive to the pressure chamber plate 20 subjected to etching. When the bonding is conducted, the nozzles 11 are positioned so as to be disposed in respective spaces of the pressure chambers 21. The pressure chamber plate 20 with the nozzle plate 10 bonded thereto is attached to a case (not shown in the figure) and the ink-jet recording head 1 is obtained.

(Manufacturing Method of the Second Embodiment)

Figure 11:
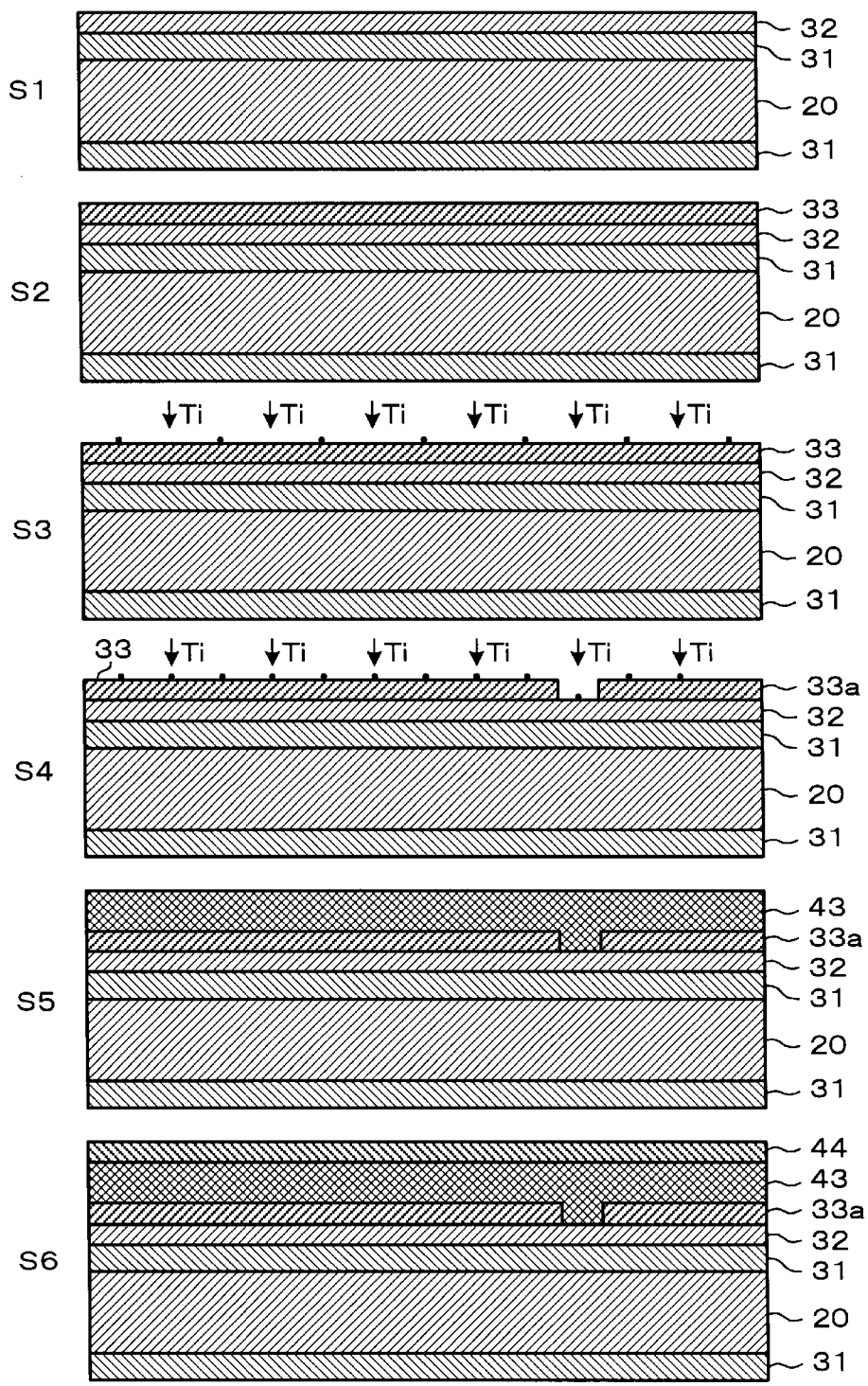
FIG. 11 is a cross-sectional schematic view illustrating a method for the manufacture of the piezoelectric element and the ink-jet recording head of the second embodiment, this figure showing the part of the process corresponding to FIG. 5 of the first embodiment.

FIG. 11 is a cross-sectional schematic view illustrating a method for the manufacture of the piezoelectric element and the ink-jet recording head of the second embodiment. This figure shows the part of the process corresponding to FIG. 5 of the first embodiment. In the process of the second embodiment, the steps other than the steps S3 through S5 of the first embodiment are the same as in the first embodiment and the explanation thereof is omitted.

Step of forming a first Ti layer (S3)

After the bottom electrode 33 of Ir and Pt is formed in the same manner as in S2 of the first embodiment, a step of forming a first Ti layer in which a Ti layer (nucleus) is formed on the bottom electrode 33 is immediately implemented. For example, a Ti layer is formed to a thickness of no less than 2 nm and no more than 18 nm by a sputtering method or the like. The first Ti layer is formed uniformly on the bottom electrode 33, but it may also have an island-like structure.

Step of patterning of the bottom electrode (S4)

Masking is then conducted to a desired shape in order to separate the bottom electrode 33 and the wiring electrode 33a, and patterning is performed by etching on the outside thereof. More specifically, first, a resist material having a uniform thickness is coated on the bottom electrode by a spinner method, a spray method, or the like (not shown in the figures). Then a mask is formed according to the shape of the piezoelectric element and then a resist pattern is formed on the bottom electrode by exposure and development (not shown in the figures). The bottom electrode 33 is then etched out by an ion milling or a dry etching method usually used therefor and the $ZrO_2$ film 32 is exposed.

Then, cleaning by a reverse sputtering (not shown in the figures) is conducted to remove contaminants or oxidized portions that adhered to the bottom electrode surface in the patterning step. In the present embodiment, the first Ti layer is formed on the bottom electrode 33. Therefore, apparently, the bottom electrode 33 is hardly negatively affected by the reverse sputtering process.

A step of forming a second Ti layer in which a Ti layer (nucleus) is further formed on the bottom electrodes 33 and the $ZrO_2$ film 32 is then continuously executed by a sputtering method or the like. The second Ti layer formed herein has a thickness of no less than 1 nm and no more than 2 nm. The thickness of the second Ti layer is preferably less than the thickness of the first Ti layer. In such a case, the reproducibility of 100 plane orientation degree is high. A sum of the thickness of the first and second Ti layers formed in the two steps is no less than 3 nm and no more than 20 nm.

Step of forming a piezoelectric film (S5)

A piezoelectric film 43 is then formed on the bottom electrode 33. First, a piezoelectric precursor film is formed by a sol-gel method. More specifically, a sol composed by an organic metal alkoxide solution is coated on the Ti nucleus by a coating method such as a spin coating method. Then, drying is conducted for a prescribed time period at a prescribed temperature to evaporate the solvent. The drying is followed by pyrolyzing for a prescribed time period at a prescribed temperature in air for thermal decomposition of organic ligands coordinated with the metal and formation of metal oxide. By repeating the coating, drying, and pyrolyzing steps for a required number of times such as two times, a two-layer piezoelectric precursor film is obtained. As a result of drying and pyrolyzing, metal alkoxide and acetic acid salt present in the solution form a metal/oxygen/metal network via thermal decomposition of ligands.

The piezoelectric precursor films are then annealed to crystallize the piezoelectric film. Due to annealing, the piezoelectric precursor film changes its structure from amorphous to a rhombohedral crystal structure and changes to a film demonstrating an electromechanical conversion effect.

Repeating several times the above-described formation of the piezoelectric film and annealing thereof makes it possible to obtain the desired thickness of the piezoelectric film. For example, the thickness of the precursor film coated in one annealing operation is 200 nm and the steps are repeated five times.

In the piezoelectric film 43 thus formed, a portion above the bottom electrode 33 is affected by the bottom electrode and the Ti layers formed in the first and second steps of forming a Ti layer. This causes the portion of the piezoelectric film has 100 plane orientation degree of about 80%. Furthermore, a portion formed in the zone from which the bottom electrode 33 was removed by patterning and where the $ZrO_2$ film 32 was exposed is affected by the second Ti layer. This causes the portion has a large orientation in 100 plane or 111 plane. Since the PZT on the $ZrO_2$ film 32 is oriented, the crystallinity of the PZT is good and the crystal grains are fine. Therefore the probability of cracking is low.

(Other Modifications)

The present invention is not limited to the above-described embodiments and may be modified for various applications. For example, the piezoelectric element manufactured in accordance with the present invention can be employed for manufacture not only of the above-described ink-jet recording head, but also of nonvolatile semiconductor memory devices, thin-film capacitors, pyroelectric detectors, sensors, surface elastic wave optical waveguides, optical memory devices, spatial light modulators, ferroelectric devices such as frequency doublers for diode lasers, dielectric devices, pyroelectric devices, piezoelectric devices, and electrooptical devices.

In accordance with the present invention, a 100 plane orientation degree of piezoelectric films can be obtained with good stability and reproducibility. Therefore, a piezoelectric element having stable and excellent piezoelectric properties at both a high frequency and a low frequency, an inkjet recording head and a printer using the same, and method for the manufacture of the piezoelectric element can be provided.

What is claimed is:

1. A piezoelectric element in which a diaphragm, a bottom electrode, a piezoelectric film, and a top electrode are successively stacked on a substrate,
    wherein said bottom electrode is patterned to a prescribed shape,
    wherein said piezoelectric film is formed on the bottom electrode that was left by the patterning and the diaphragm from which the bottom electrode was removed, and
    wherein a portion of said piezoelectric film, which was formed on the bottom electrode that was left by said patterning has a larger number of layers than the portion formed on said diaphragm from which the bottom electrode was removed.

2. The piezoelectric element according to claim 1, wherein, in the portion of said piezoelectric film that was formed on the bottom electrode, the layers have a continuous crystal structure.

3. A piezoelectric element in which a diaphragm, a bottom electrode, a piezoelectric film, and a top electrode are successively stacked on a substrate,
    wherein said bottom electrode is patterned to a prescribed shape,
    wherein said piezoelectric film is formed on the bottom electrode that was left by the patterning and the diaphragm from which the bottom electrode was removed,
    wherein said bottom electrode has a uniform thickness, and
    wherein a portion of said piezoelectric film, which was formed on the bottom electrode that was left by said patterning, has a 100 plane orientation degree of no less than 70%.

4. The piezoelectric element according to claim 3, wherein, in the portion of said piezoelectric film that was formed on the bottom electrode, a plurality of layers has a continuous crystal structure.

5. A piezoelectric element in which a diaphragm, a bottom electrode, a piezoelectric film, and a top electrode are successively stacked on a substrate,
    wherein said bottom electrode is patterned to a prescribed shape,
    wherein said piezoelectric film is formed on the bottom electrode that was left by the patterning and the diaphragm from which the bottom electrode was removed,
    wherein a portion of said piezoelectric film, which was formed on said diaphragm, has a prescribed orientation, and
    wherein a portion of said piezoelectric film, which was formed on the bottom electrode that was left by said patterning, has a 100 plane orientation degree of no less than 70%.

6. The piezoelectric element according to claim 5, wherein a portion of said piezoelectric film, which was formed on said diaphragm from which said bottom electrode was removed, has a large orientation in a 100 plane or a 111 plane.

7. An ink-jet recording head, comprising:
    the piezoelectric elements described in claim 1, 3 or 5;
    pressure chambers whose internal volume is changed by mechanical displacement of said piezoelectric elements; and
    ejection openings linked to said pressure chambers and ejecting ink droplets.

8. An ink-jet printer comprising the ink-jet recording head described in claim 7 in a printing mechanism.

* * * * *